(12) United States Patent
Ma et al.

(10) Patent No.: US 10,312,262 B2
(45) Date of Patent: Jun. 4, 2019

(54) DISPLAY PANEL AND DISPLAY DEVICE

(71) Applicant: BOE TECHNOLOGY GROUP CO., LTD., Beijing (CN)

(72) Inventors: Yongda Ma, Beijing (CN); Xinyin Wu, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 79 days.

(21) Appl. No.: 15/325,555

(22) PCT Filed: Feb. 16, 2016

(86) PCT No.: PCT/CN2016/073836
§ 371 (c)(1),
(2) Date: Jan. 11, 2017

(87) PCT Pub. No.: WO2017/045350
PCT Pub. Date: Mar. 23, 2017

(65) Prior Publication Data
US 2018/0226429 A1 Aug. 9, 2018

(30) Foreign Application Priority Data
Sep. 17, 2015 (CN) .................... 2015 2 0724273 U

(51) Int. Cl.
*H01L 27/12* (2006.01)
*G02F 1/1335* (2006.01)

(52) U.S. Cl.
CPC ...... *H01L 27/124* (2013.01); *G02F 1/133512* (2013.01); *H01L 27/1248* (2013.01)

(58) Field of Classification Search
CPC ............... H01L 27/124; H01L 27/1248; G02F 1/133512; G02F 1/134309; G02F 1/136209; G02F 1/136286
See application file for complete search history.

(56) References Cited

U.S. PATENT DOCUMENTS 5,953,088 A * 9/1999 Hanazawa ........ G02F 1/136213
349/110
6,809,789 B2 * 10/2004 Kim .................. G02F 1/133784
349/139

(Continued)

FOREIGN PATENT DOCUMENTS

| CN | 104267534 A | 1/2015 |
| CN | 104407480 A | 3/2015 |

(Continued)

OTHER PUBLICATIONS

International Search Report dated Jun. 13, 2016.

*Primary Examiner* — Syed I Gheyas
(74) *Attorney, Agent, or Firm* — Dilworth & Barrese, LLP.; Michael J. Musella, Esq.

(57) ABSTRACT

Disclosed are a display panel and a display device. The display panel includes: a first substrate and a second substrate disposed as opposed to each other. The first substrate includes gate lines (1) and data lines (2), and pixel units (6) defined by the gate lines (1) and the data lines (2). The second substrate includes a black matrix (4), the black matrix (4) having a plurality of apertures (7) configured as corresponding to the pixel units (6). A orthographic projection of at least one side of at least a part of the plurality of apertures in a plane of the first substrate is at least partially located outside the pixel units (6).

16 Claims, 3 Drawing Sheets

(56) References Cited

U.S. PATENT DOCUMENTS

| | | | | |
|---|---|---|---|---|
| 6,914,657 | B2* | 7/2005 | Kim | G02F 1/134309 |
| | | | | 349/110 |
| 7,030,947 | B2* | 4/2006 | Moon | G02F 1/136209 |
| | | | | 349/110 |
| 7,145,621 | B2* | 12/2006 | Lee | G02F 1/133512 |
| | | | | 349/141 |
| 7,271,856 | B2* | 9/2007 | Kim | G02F 1/134336 |
| | | | | 349/38 |
| 2014/0043575 | A1 | 2/2014 | Lee et al. | |
| 2015/0092132 | A1 | 4/2015 | Kang et al. | |
| 2015/0138479 | A1* | 5/2015 | Lee | G02F 1/136286 |
| | | | | 349/44 |
| 2016/0202538 | A1* | 7/2016 | Lee | G02F 1/133345 |
| | | | | 257/72 |

FOREIGN PATENT DOCUMENTS

| | | |
|---|---|---|
| CN | 104656316 A | 5/2015 |
| CN | 204945587 U | 1/2016 |
| WO | 2013021884 A1 | 2/2013 |

* cited by examiner

DISPLAY PANEL AND DISPLAY DEVICE

FIELD OF THE ART

Embodiments of the disclosed herein relate to the field of display technologies, more particularly, to a display panel and a display device.

BACKGROUND

FIG. 1 is a top view a conventional display panel. The display panel comprises a first substrate and a second substrate, and liquid crystals are filled in between the first and second substrate. As illustrated in FIG. 1, the first substrate comprises gate lines 1, data lines 2, and a Thin Film Transistor (TFT) 3, a pixel unit 6 (that is, a region defined by edges of gate lines 1 and data lines 2) is defined by the gate lines 1 and the data lines 2. The pixel unit 6 has a pixel electrode 5 disposed therein, and a passivation layer is formed over the TFT 3. A via hole is formed in the passivation layer, the pixel electrode 5 may be connected to a drain electrode of the TFT by way of the via hole. The second substrate comprises a black matrix 4, which is configured as corresponding to the gate lines 1, the data lines 2 and the TFT 3, such that light of pixel is partitioned.

It is seen from FIG. 1 that the black matrix 4 is normally configured as completely overlaying the gate lines and the data lines, in consideration of factors such as light leakage of the display panel and unstable electric fields at peripheral regions of the pixel electrode. That is, orthographic projections of sides of an aperture 7 in the black matrix 4 in a plane of the substrate are configured as falling within the pixel unit 6 or being aligned to edges of the gate lines 1 and/or the data lines 2.

However, the above configuration will make the black matrix 4 to cover a relatively large area, which makes the pixel of the display panel to have a small aperture ratio. Moreover, such a black matrix 4 also limits a viewing angle of the display panel.

SUMMARY

Embodiments of the disclosed herein provide a display panel and display device which can effectively increase the viewing angle of the display panel and the aperture ratio of the pixel.

In a first aspect of the disclosed herein, it is provided a display panel, which comprises a first substrate and a second substrate disposed as being parallel to each other, wherein the first substrate comprises a plurality of gate lines and a plurality of data lines as well as a plurality of pixel units defined by the plurality of gate lines and the plurality of data lines; wherein the second substrate comprises a black matrix, the black matrix having a plurality of apertures configured as corresponding to the plurality of pixel units; wherein an orthographic projection of at least one side of at least a part of the plurality of apertures in a plane of the first substrate is at least partially located outside a corresponding pixel unit.

In an embodiment of the disclosed herein, the first substrate further comprises a plurality of pixel electrode configured as corresponding to the plurality of pixel units, and an orthographic projection of an edge of a pixel electrode in a plane of the first substrate is located outside a corresponding pixel unit.

In an embodiment of the disclosed herein, the orthographic projection of at least one side of the at least a part of plurality of apertures in the plane of the first substrate, which is located outside the corresponding pixel unit, overlaps with the corresponding pixel electrode.

In an embodiment of the disclosed herein, the apertures are configured as chamfers in regions corresponding to four corners of the pixel unit, and the chamfers completely overlay the corners of corresponding pixel unit.

In an embodiment of the disclosed herein, orthographic projections of respective sides of each of the plurality of apertures in a plane of the first substrate are all located outside the corresponding pixel unit.

In an embodiment of the disclosed herein, the black matrix comprises row light-shielding strips corresponding to the plurality of gate lines and column light-shielding strips corresponding to the plurality of data lines, and a width L3 of each of column light-shielding strips satisfies the following:

$$L3 \geq \frac{(h - h1 - h2) * L1}{h2} - L2$$

wherein L1 is a distance between two neighboring data lines along a row direction, L2 is a distance between an edge of a column light-shielding strip and an edge of a corresponding data line along the row direction, h is a distance between a surface of a data line far away from a column light-shielding strip and a surface of the corresponding column light-shielding strip far away from a data line, h1 is a thickness of the column light-shielding strip, and h2 is a thickness of the data line.

In an embodiment of the disclosed herein, the black matrix comprises row light-shielding strips corresponding to the plurality of gate lines and column light-shielding strips corresponding to the plurality of data lines, and a width L3' of each of the row light-shielding strips satisfies the following:

$$L3' \geq \frac{(h' - h1' - h2') * L1'}{h2'} - L2'$$

wherein L1' is a distance between two neighboring gate lines along a column direction, L2' is a distance between an edge of a row light-shielding strip and an edge of a corresponding gate line along the column direction, h' is a distance between a surface of a gate line far away from a row light-shielding strip and a surface of the corresponding row light-shielding strip far away from the gate line, h1' is a thickness of the row light-shielding strip, and h2' is a thickness of the gate line.

In a second aspect of the disclosed herein, it is provided a display device comprising the display panel.

The disclosed herein has the following advantageous effects:

The black matrix in the display panel in accordance with the embodiments of the disclosed herein does not completely overlay the gate line and the data lines. As a result, the display panel will not leak light, and the viewing angle of the display panel and the aperture ratio of the pixel can be increased.

BRIEF DESCRIPTION OF THE DRAWINGS

In order to clearly illustrate the technical solution of the embodiments of the disclosed herein, the drawings of the embodiments will be briefly described in the following; it is obvious that the described drawings are only related to some embodiments of the disclosed herein and thus are not limitative of the disclosed herein.

DETAILED DESCRIPTION

In order to make objects, technical details and advantages of the embodiments of the disclosed herein apparent, the technical solutions of the embodiment will be described in a clearly and fully understandable way in connection with the drawings related to the embodiments of the disclosed herein. It is obvious that the described embodiments are just a part but not all of the embodiments of the disclosed herein. Based on the described embodiments herein, those skilled in the art can obtain other embodiment(s), without any inventive work, which should be within the scope of the disclosed herein.

Figure 2:
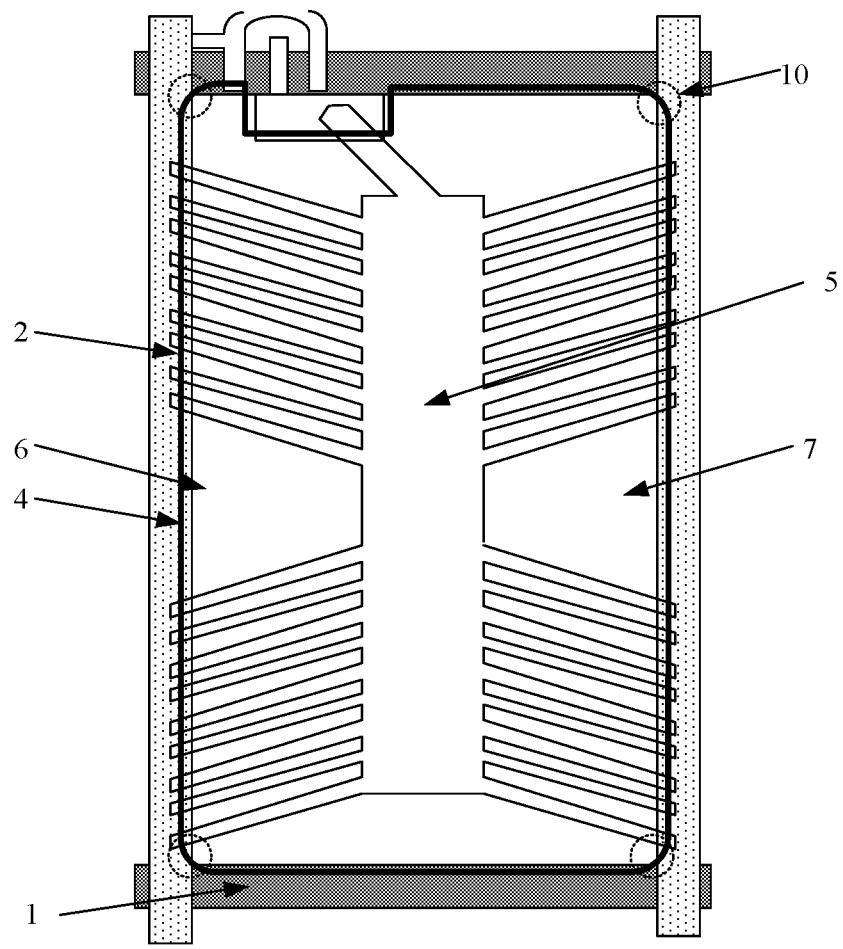
FIG. 2 is a top view of a display panel in accordance with an embodiment of the disclosed herein.

FIG. 2 is a top view of a display panel in accordance with an embodiment of the disclosed herein.

The display panel may comprise a first substrate and a second substrate disposed as being parallel to each other. As illustrated in FIG. 2, the first substrate comprises a gate line 1 and a data line 2 as well as a pixel unit 6 defined by the gate lines 1 and the data lines 2. Though only one pixel unit 6 is illustrated in FIG. 2, a person skilled in the art will understand that the first substrate of the display panel in accordance with the embodiment of the disclosed herein may comprise a plurality of gate lines 1 and a plurality of data lines 2 as well as a plurality of pixel units 6 defined by the plurality of gate lines 1 and the plurality of data lines 2.

As illustrated in FIG. 2, the second substrate of the display panel in accordance with the embodiment of the disclosed herein comprises a black matrix 4, and the black matrix 4 has a plurality of apertures 7 corresponding to respective pixel units formed in the black matrix (only one aperture 7 is illustrated in FIG. 2). In accordance with an embodiment of the disclosed herein, an orthographic projection of at least one side of at least a part of the apertures of the plurality of apertures 7 in a plane of the first substrate 1 is located at least partially outside the pixel unit 6. As the first substrate is parallel to the second substrate, the plane of the first substrate may also be the plane of the second substrate.

It is noted that the black matrix 4 may be equivalent to a structure consisting of a plurality of row light-shielding strips and a plurality of column light-shielding strips. The respective row light-shielding strips are arranged corresponding to the respective gate lines 1, and the respective column light-shielding strips are arranged corresponding to the respective data lines. In the following, details of the technical solution of the disclosed herein will be described by taking column light-shielding strips as an example. However, it can be contemplated that technical details described with reference to the column light-shielding strips arranged corresponding to the respective data lines 2 may be similarly used to describe row light-shielding strips arranged corresponding to the respective gate lines 1.

Figure 3:
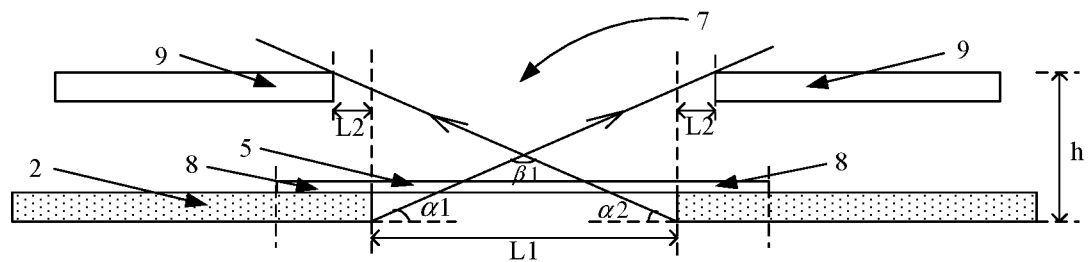
FIG. 3 schematically illustrates viewing angles of pixel units of a display panel in accordance with an embodiment of the disclosed herein.

FIG. 3 schematically illustrates viewing angles of a pixel unit of a display panel in accordance with an embodiment of the disclosed herein.

According to an embodiment of the disclosed herein, an orthographic projection of a column light-shielding strip 9 which conceptually forms the black matrix 4 in the plane of the first substrate is completely within the corresponding data line 2.

As illustrated in FIG. 3, a distance between two neighboring data lines 2 along the row direction is L1, a distance between a data line 2 and a corresponding column light-shielding strip 9 is h (that is, a distance between a lower surface of the date line 2 and an upper surface of the black matrix 4 is h), and a distance between an edge of the column light-shielding strip 9 and an edge of the data line 2 along the row direction is L2. It can be thus deduced that:

$$\alpha 1 = \alpha 2 = \arctan\frac{h}{L1+L2}$$

Therefore, a viewing angle along the row direction of the pixel unit 6 of the display panel in accordance with the embodiment of the disclosed herein is $\beta 1=180°-\alpha 1-\alpha 2$; as a result $$\beta 1 = 180° - 2*\arctan\frac{h}{L1+L2}.$$

Figure 4:
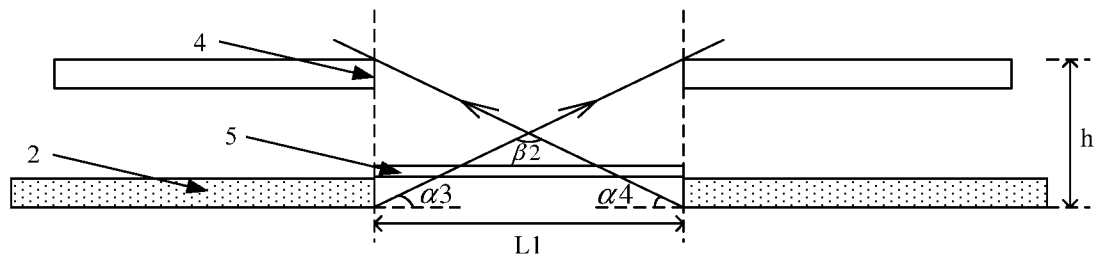
FIG. 4 schematically illustrates viewing angles of pixel units of a display panel in accordance with a comparative example.

FIG. 4 schematically illustrates viewing angles of a pixel unit of a display panel in accordance with a comparative example.

As illustrated in FIG. 4, in the present comparative example, a distance between two neighboring data lines 2 along the row direction is L1, a distance between a surface of a data line 2 far away from a column light-shielding strip 4 and a surface of a corresponding column light-shielding strip 4 far away from the data line 2 is h, and an edge of the column light-shielding strip 4 is aligned with an edge of the data line 2. It is thus deduced that:

$$\alpha 3 = \alpha 4 = \arctan\frac{h}{L1}$$

Considering that $\beta 2=180'-\alpha 3-\alpha 4$,
Therefore, $$\beta 2 = 180° - 2*\arctan\frac{h}{L1}°$$

As a result, the view angle along the row direction of the pixel unit in the display panel according to the comparative example is $\beta 2=180°-\alpha 3-\alpha 4$, therefore $$\beta 2 = 180° - 2*\arctan\frac{h}{L1}.$$

It is seen from the above that β1>β2. That is, the viewing angle along the row direction of the pixel unit in the display panel according to the embodiment of the disclosed herein is larger than that of the pixel unit in the display panel according to the comparative example (that is the conventional art). Therefore, the embodiment of the disclosed herein can effectively increase the viewing angle along the row direction of the pixel unit in the display panel.

It is noted that the above embodiment is described with reference to an example where the orthographic projections of both edges of the aperture 7 in the black matrix 4 corresponding to the data line 2 in the plane of the first substrate are outside the pixel unit 6. According to an embodiment of the disclosed herein, it is also contemplated that the orthographic projection of one of the two edges of the aperture 7 corresponding to the data line 2 in the plane of the first substrate is outside the pixel unit 6. For example, only the edge of column light-shielding strip 9 on the left side of FIG. 3 is distanced from the edge of the data line 2 by L2, while the column light-shielding strip 4 on the right side may be a column light-shielding strip 9 as illustrated in FIG. 4, with an edge aligned to that of the data line 2. According to such an embodiment, it can also increase the viewing angle along the row direction of the pixel unit 6.

A person skilled in the art will understand that the viewing angle of the pixel unit 6 along the column direction can be increased when the orthographic projection of the row light-shielding strip in the plane of the first substrate completely falls within the corresponding gate line 1.

According to an embodiment of the disclosed herein, when the orthographic projection of at least one edge of the aperture 7 in the black matrix 4 in the plane of the first substrate is at least partially located outside the pixel unit 6, the viewing angle of the pixel unit 6 can be increased, thereby increasing the viewing angle of the display panel. In the meantime, when the orthographic projections of all edges of the aperture 7 in the plane of the first substrate are all located outside the pixel unit 6, the viewing angle of the display panel can be increased to its maximum.

In comparison with the conventional art, the black matrix in the display panel of the disclosed herein covers a smaller area, thereby increasing the aperture ratio of the pixels of the display panel.

It is noted that it is technical prejudice in the conventional art that the black matrix 4 has to be configured as completely overlaying the gate line 1 and the data line 2 (that is, orthographic projections of all edges of all apertures in the black matrix 4 in the plane of the first substrate are aligned with the gate line 1 and the data line 2, or are within the pixel unit), so as to resolve the problem of leaking light by the display panel. However, it is found by the inventors that it can still prevent the display panel from leaking light when the size of the black matrix 4 is modestly reduced such that the black matrix 4 does not completely overlay the gate line 1 and/or the data line 2. That is to say, the technical solution of the disclosed herein solves the problem of leaking light by the display panel while overcoming the technical prejudice that the black matrix 4 has to completely overlay the gate line 1 and the data line 2, thereby effectively increasing the viewing angle of the display panel and the pixel aperture ratio.

Referring to FIGS. 2 and 3 again, according to an embodiment of the disclosed herein, the first substrate further comprises a pixel electrode 5 corresponding to the pixel unit 6. An orthographic projection of an edge of the pixel electrode 5 in the plane of the first substrate is outside the pixel unit 6.

Figure 1:
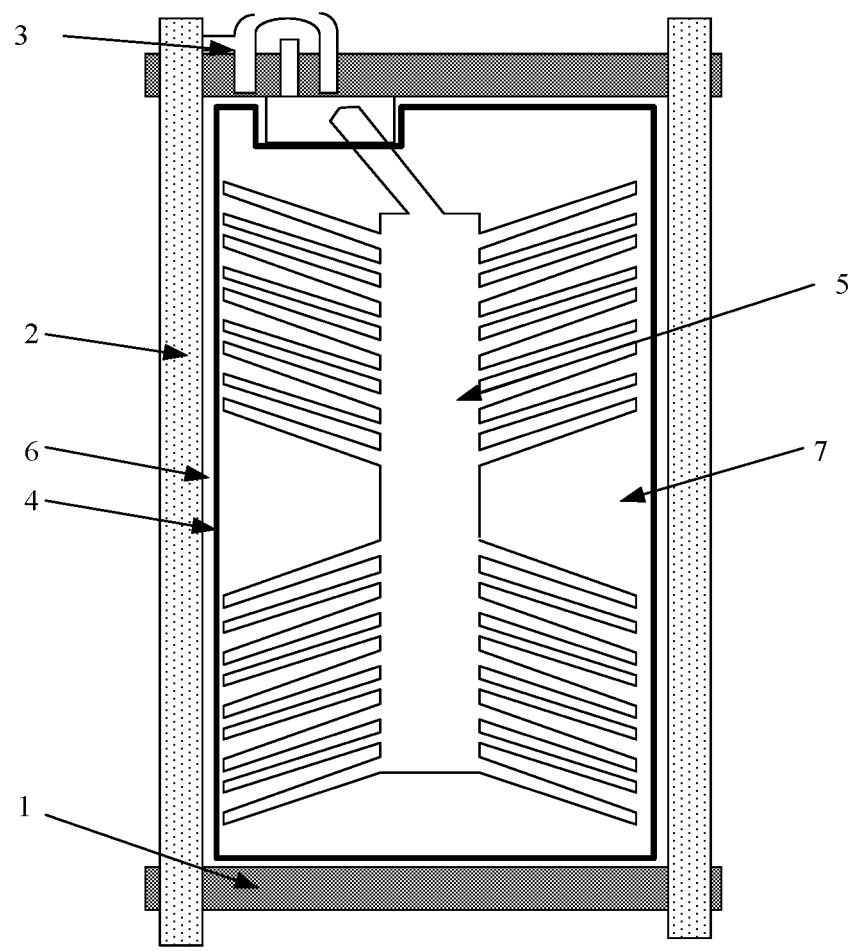
FIG. 1 is a top view of a conventional display panel.

In the conventional art, edges of the pixel electrode 5 are within the pixel unit 6 or aligned with the edges of the pixel unit 6, as illustrated in FIGS. 1 and 4. As electric fields at the edge of the pixel electrode 5 are not even, abnormal display will be caused at the edge of the pixel unit 6. To solve the above technical problem, the size of the pixel electrode 5 may be increased, such that the orthographic projection of the pixel electrode 5 in the plane of the first substrate may have an overlapping region 8 with the data line 2, as illustrated in FIG. 3. The edge of the pixel electrode 5 may be outside the pixel unit 6 and covered by the black matrix 4. In the meantime, the edge of the pixel unit 6 corresponds to the non-edge region of the pixel electrode 5, therefore the uneven electric fields at the edge of the pixel electrode 5 will not influence the display at the edge of the pixel unit 6, thus solving the problem of having abnormal display at the edge of the pixel unit 6 with the conventional art. Though not clearly indicated in the drawing, a person skilled in the art will understand that an insulation film may be disposed between the overlapping region 8 of the pixel electrode 8 and the data line, so as to prevent direct electrical connection between the pixel electrode 5 and the data line 2.

According to an embodiment of the disclosed herein, the black matrix 4 may partially overlay the overlapping region 8 of the pixel electrode 5 in the plane of the first substrate. That is, the orthographic projection of a side of the aperture in the plane of the first substrate, which is located outside the corresponding pixel unit, overlaps with the corresponding pixel electrode 5. As illustrated in FIG. 3, a distance L2 between the side of the aperture 7 and the edge of the pixel unit 6 along the row direction is smaller than a distance between the edge of the pixel electrode 5 and the edge of the pixel unit 6, that is, the column light-shielding strip 9 partially overlay the overlapping region 8 of the pixel electrode 5 in the plane of the first substrate. According to an embodiment of the disclosed herein, it not only ensures that the display panel does not leak light when the gate line 1 and the data line 2 are not completely covered by the black matrix 4, but also ensures that the black matrix 4 overlays the edge region of the pixel electrode 5.

While increasing the viewing angel of the pixel unit 6, it is possible that the black matrix 4 can partition light emitted by the pixel unit 6. To ensure that light emitted by the pixel unit will not incident to a display region of a neighboring pixel unit, the light emitted by the pixel unit will not propagate to not only a neighboring pixel unit along the row direction through a gap between the data line and the column light-shielding strip, but also a neighboring pixel unit along the column direction through a gap between the gate line and the row light-shielding strip.

Figure 5:
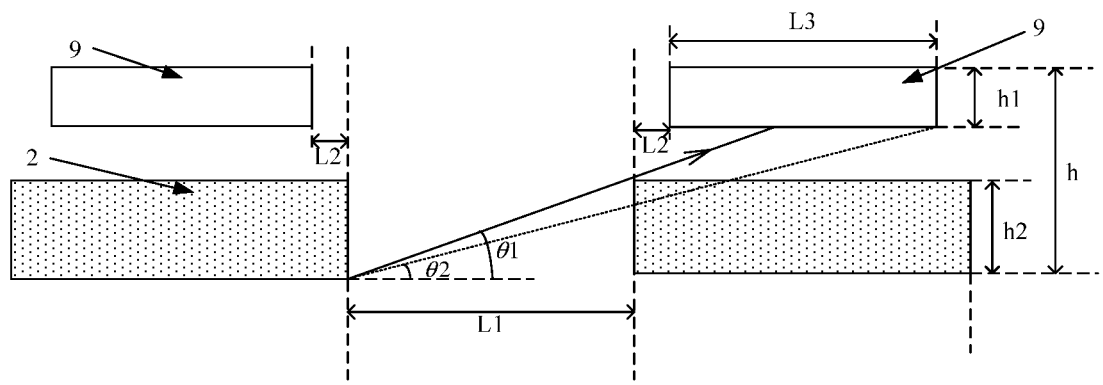
FIG. 5 is a schematic diagram illustrating a principle of light-shielding strips for partitioning light of a pixel unit in a display panel in accordance with an embodiment of the disclosed herein.

FIG. 5 is a schematic diagram illustrating a principle of light-shielding strips for partitioning light of a pixel unit in a display panel in accordance with an embodiment of the disclosed herein. As illustrated in FIG. 5, still referring to the example of the column light-shielding strip 9 and the corresponding data line 2, it has to ensure that θ1≤θ2. With reference to FIG. 5, $$\tan\theta 1 = \frac{h2}{L1} \text{ and } \tan\theta 2 = \frac{h - h1}{L1 + L2 + L3}.$$

where L1 is a distance between two neighboring data lines 2 along a row direction, L2 is a distance between an edge of a column light-shielding strip 9 and an edge of a corresponding data line 2 along the row direction, L3 is a width of the column light-shielding strip 9, h is a distance between a surface of a data line 2 far away from a column light-shielding strip and a surface of the corresponding column light-shielding strip 9 far away from the data line 2, h1 is a thickness of the column light-shielding strip 9, and h2 is a thickness of the data line 2.

θ1≥θ2 is satisfied when tan θ1≥tan θ2. Therefore it has to satisfy the following:

$$\frac{h2}{L1} \geq \frac{h-h1}{L1+L2+L3}.$$

From which it is found that the width of the column light-shielding strip 9 needs to be:

$$L3 \geq \frac{(h-h1-h2)*L1}{h2} - L2$$

Based on similar analysis, it can be deduced that the width L3' of the row light-shielding strip has to be:

$$L3' \geq \frac{(h'-h1'-h2')*L1'}{h2'} - L2'$$

where L1' is a distance between two neighboring gate lines 1 along a column direction, L2' is a distance between an edge of a row light-shielding strip and an edge of a corresponding gate line 1 along the column direction, h' is a distance between a surface of a gate line 1 far away from a row light-shielding strip and a surface of the corresponding row light-shielding strip far away from the gate line 1, h1' is a thickness of the row light-shielding strip, and h2' is a thickness of the gate line 1.

According to an embodiment of the disclosed herein, the aperture 7 may be configured as chamfers 10 in regions corresponding to four corners of the pixel unit 6, and the chamfers 10 may completely overlay corners of corresponding pixel unit 6.

As the corners of the pixel unit 6 are with an intersecting region of the gate line 1 and the data line 2, they are influenced both by the gate line 1 and by the data line 2. As a result, electric fields formed in the corners of the pixel unit 6 are not stable, which will cause abnormal display to be present in the corner regions of the pixel unit 6 easily. To solve the above problem, the chamfers 10 may be used to cover the corners of the pixel unit 6, thereby effectively preventing abnormal display by the pixel unit.

The display panel of the disclosed herein may be applied to various display devices.

It can be understood that the aforementioned implementations are described as exemplary embodiments for illustrating the principle of the disclosed herein, but not limitative to the scope of the disclosure. Various changes and modifications can be made by those skilled in the art without departing from the spirits and scopes of the disclosure, and the changes and modifications are also included in the scope of the disclosure.

What is claimed is:

1. A display panel, comprising:
a first substrate, comprising a plurality of gate lines and a plurality of data lines as well as a plurality of pixel units defined by the plurality of gate lines and the plurality of data lines; and
a second substrate, disposed as being parallel to the first substrate and comprising a black matrix, the black matrix having a plurality of apertures configured as corresponding to the plurality of pixel units, an orthographic projection of at least one side of at least a part of the plurality of apertures in a plane of the first substrate being at least partially located outside a corresponding pixel unit, and the plurality of apertures being configured as chamfers in regions corresponding to four corners of the pixel unit, and the chamfers completely overlay the four corners of the pixel unit.

2. The display panel of claim 1, wherein the first substrate further comprises a plurality of pixel electrode configured as corresponding to the plurality of pixel units, and an orthographic projection of an edge of a pixel electrode in a plane of the first substrate is located outside a corresponding pixel unit.

3. The display panel of claim 2, wherein the orthographic projection of at least one side of the at least a part of plurality of apertures in the plane of the first substrate, which is located outside the corresponding pixel unit, overlaps with the corresponding pixel electrode.

4. The display panel of claim 1, wherein orthographic projections of respective sides of each of the plurality of apertures in a plane of the first substrate are all located outside the corresponding pixel unit.

5. The display panel of claim 1, wherein the black matrix comprises row light-shielding strips corresponding to the plurality of gate lines and column light-shielding strips corresponding to the plurality of data lines, and a width L3 of each of column light-shielding strips satisfies the following:

$$L3 \geq \frac{(h-h1-h2)*L1}{h2} - L2$$

wherein L1 is a distance between two neighboring data lines along a row direction, L2 is a distance between an edge of a column light-shielding strip and an edge of a corresponding data line along the row direction, h is a distance between a surface of a data line far away from a column light-shielding strip and a surface of the corresponding column light-shielding strip far away from a data line, h1 is a thickness of the column light-shielding strip, and h2 is a thickness of the data line.

6. The display panel of claim 1, wherein the black matrix comprises row light-shielding strips corresponding to the plurality of gate lines and column light-shielding strips corresponding to the plurality of data lines, and a width L3' of each of the row light-shielding strips satisfies the following:

$$L3' \geq \frac{(h'-h1'-h2')*L1'}{h2'} - L2'$$

wherein L1' is a distance between two neighboring gate lines along a column direction, L2' is a distance between an edge of a row light-shielding strip and an edge of a corresponding gate line along the column direction, h' is a distance between a surface of a gate line far away from a row light-shielding strip and a surface of the corresponding row light-shielding strip far away from the gate line, h1' is a thickness of the row light-shielding strip, and h2' is a thickness of the gate line.

7. A display device comprising the display panel of claim 1.

8. The display device of claim 7, wherein the first substrate further comprises a plurality of pixel electrode configured as corresponding to the plurality of pixel units, and an orthographic projection of an edge of a pixel electrode in a plane of the first substrate is located outside a corresponding pixel unit.

9. The display device of claim 8, wherein the orthographic projection of at least one side of the at least a part of plurality of apertures in the plane of the first substrate, which is located outside the corresponding pixel unit, overlaps with the corresponding pixel electrode.

10. The display device of claim 7, wherein the apertures are configured as chamfers in regions corresponding to four corners of the pixel unit, and the chamfers completely overlay the corners of corresponding pixel unit.

11. The display panel of claim 2, wherein orthographic projections of respective sides of each of the plurality of apertures in a plane of the first substrate are all located outside the corresponding pixel unit.

12. The display panel of claim 3, wherein orthographic projections of respective sides of each of the plurality of apertures in a plane of the first substrate are all located outside the corresponding pixel unit.

13. The display panel of claim 2, wherein the black matrix comprises row light-shielding strips corresponding to the plurality of gate lines and column light-shielding strips corresponding to the plurality of data lines, and a width L3 of each of column light-shielding strips satisfies the following:

$$L3 \geq \frac{(h - h1 - h2) * L1}{h2} - L2$$

wherein L1 is a distance between two neighboring data lines along a row direction, L2 is a distance between an edge of a column light-shielding strip and an edge of a corresponding data line along the row direction, h is a distance between a surface of a data line far away from a column light-shielding strip and a surface of the corresponding column light-shielding strip far away from a data line, h1 is a thickness of the column light-shielding strip, and h2 is a thickness of the data line.

14. The display panel of claim 3, wherein the black matrix comprises row light-shielding strips corresponding to the plurality of gate lines and column light-shielding strips corresponding to the plurality of data lines, and a width L3 of each of column light-shielding strips satisfies the following:

$$L3 \geq \frac{(h - h1 - h2) * L1}{h2} - L2$$

wherein L1 is a distance between two neighboring data lines along a row direction, L2 is a distance between an edge of a column light-shielding strip and an edge of a corresponding data line along the row direction, h is a distance between a surface of a data line far away from a column light-shielding strip and a surface of the corresponding column light-shielding strip far away from a data line, h1 is a thickness of the column light-shielding strip, and h2 is a thickness of the data line.

15. The display panel of claim 2, wherein the black matrix comprises row light-shielding strips corresponding to the plurality of gate lines and column light-shielding strips corresponding to the plurality of data lines, and a width L3' of each of the row light-shielding strips satisfies the following:

$$L3' \geq \frac{(h' - h1' - h2') * L1'}{h2'} - L2'$$

wherein L1' is a distance between two neighboring gate lines along a column direction, L2' is a distance between an edge of a row light-shielding strip and an edge of a corresponding gate line along the column direction, h' is a distance between a surface of a gate line far away from a row light-shielding strip and a surface of the corresponding row light-shielding strip far away from the gate line, h1' is a thickness of the row light-shielding strip, and h2' is a thickness of the gate line.

16. The display panel of claim 3, wherein the black matrix comprises row light-shielding strips corresponding to the plurality of gate lines and column light-shielding strips corresponding to the plurality of data lines, and a width L3' of each of the row light-shielding strips satisfies the following:

$$L3' \geq \frac{(h' - h1' - h2') * L1'}{h2'} - L2'$$

wherein L1' is a distance between two neighboring gate lines along a column direction, L2' is a distance between an edge of a row light-shielding strip and an edge of a corresponding gate line along the column direction, h' is a distance between a surface of a gate line far away from a row light-shielding strip and a surface of the corresponding row light-shielding strip far away from the gate line, h1' is a thickness of the row light-shielding strip, and h2' is a thickness of the gate line.

* * * * *